(12) United States Patent
Mustafa et al.

(10) Patent No.: US 12,054,826 B2
(45) Date of Patent: Aug. 6, 2024

(54) ALD CYCLE TIME REDUCTION USING PROCESS CHAMBER LID WITH TUNABLE PUMPING

(71) Applicant: Applied Materials, Inc., Santa Clara, CA (US)

(72) Inventors: Muhannad Mustafa, Milpitas, CA (US); Muhammad M. Rasheed, San Jose, CA (US); Mario D. Sanchez, San Jose, CA (US); Anqing Cui, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 18/224,206

(22) Filed: Jul. 20, 2023

(65) Prior Publication Data

US 2023/0357927 A1    Nov. 9, 2023

Related U.S. Application Data

(62) Division of application No. 17/028,184, filed on Sep. 22, 2020, now Pat. No. 11,767,590.

(60) Provisional application No. 63/048,307, filed on Jul. 6, 2020, provisional application No. 62/903,908, filed on Sep. 22, 2019.

(51) Int. Cl.
*C23C 16/455* (2006.01)
*C23C 16/44* (2006.01)

(52) U.S. Cl.
CPC .... *C23C 16/45544* (2013.01); *C23C 16/4408* (2013.01)

(58) Field of Classification Search
CPC .......... C23C 16/45544; C23C 16/4408; C23C 16/4412
See application file for complete search history.

(56) References Cited

U.S. PATENT DOCUMENTS 5,425,812 A * 6/1995 Tsutahara ................ C23C 16/46
                                                                118/733
5,964,947 A   10/1999 Zhao et al.
8,444,926 B2   5/2013 Fodor et al.
(Continued)

FOREIGN PATENT DOCUMENTS

JP    2004339566 A   12/2004
TW    201320182 A    5/2013
(Continued)

OTHER PUBLICATIONS

PCT International Search Report and Written Opinion in PCT/US2020/051967 dated Jan. 13, 2021, 11 pages.

*Primary Examiner* — Patrick C Williams
(74) *Attorney, Agent, or Firm* — Servilla Whitney LLC (57) ABSTRACT

Process chamber lids having a pumping liner with a showerhead and gas funnel within an open central region are described. The showerhead is spaced a distance from the gas funnel to form a gap and the gas funnel has an opening to provide a flow of gas into the gap. The gas funnel includes a plurality of apertures extending from the front surface to a common region adjacent the back surface of the gas funnel. A purge ring is in contact with the back surface of the gas funnel and aligned so that a circular channel formed in the bottom surface of the purge ring body is positioned adjacent the common area of the apertures in the gas funnel.

15 Claims, 11 Drawing Sheets

(56) References Cited

U.S. PATENT DOCUMENTS

| | | |
|---|---|---|
| 2005/0208217 A1 | 9/2005 | Shinriki et al. |
| 2012/0145078 A1 | 6/2012 | Huang et al. |
| 2013/0267045 A1 | 10/2013 | Lee et al. |
| 2014/0103145 A1 | 4/2014 | White et al. |
| 2015/0152551 A1 | 6/2015 | Yamaguchi et al. |
| 2016/0312360 A1* | 10/2016 | Rasheed ........... C23C 16/45591 |
| 2017/0009347 A1 | 1/2017 | Jang et al. |
| 2017/0283945 A1 | 10/2017 | Yahata et al. |
| 2017/0298509 A1 | 10/2017 | Dubois et al. |
| 2019/0122872 A1 | 4/2019 | Ghosh et al. |

FOREIGN PATENT DOCUMENTS

| | | |
|---|---|---|
| TW | 201602399 A | 1/2016 |
| TW | 201718927 A | 6/2017 |

\* cited by examiner

ALD CYCLE TIME REDUCTION USING PROCESS CHAMBER LID WITH TUNABLE PUMPING

CROSS-REFERENCE TO RELATED APPLICATIONS

This application is a divisional of U.S. patent application Ser. No. 17/028,184, filed Sep. 22, 2020, which claims priority to U.S. Provisional Application No. 63/048,307, filed Jul. 6, 2020, and U.S. Provisional Application No. 62/903,908, filed Sep. 22, 2019, the entire disclosures of which are hereby incorporated by reference herein.

TECHNICAL FIELD

Embodiments of the present disclosure generally relate to apparatus to deposit thin films. In particular, embodiments of the disclosure relate to process chamber lids and process chamber lid components.

BACKGROUND

Semiconductor manufacturing typically involves applying a number of processes to a substrate such as a silicon wafer. Semiconductor manufacturing processes are generally performed under controlled conditions such as high vacuum in dedicated processing chambers. The processes applied may include depositing a thin film of a metal or other substance on the wafer by chemical vapor deposition (CVD) or atomic layer deposition (ALD). All CVD and ALD processes require uniform gas distribution to maximize the uniformity of precursor delivery on the wafer.

Most of the time, ALD processes struggle to avoid cross-talk between two precursors. The cross-talk issue can arise from a number of sources including, but not limited to, residual precursor remaining the showerhead or in the reactor. Therefore, processes need longer purging and, therefore, longer pumping to remove all of the precursors left in the system. The total throughput decreases due to longer cycle times.

Current designs do not allow for fast pump-purge cycling for residual precursor removal. Rapid pumping through the showerhead is possible to remove but the small holes in the showerhead can result in flow choking during pumping. This increases the amount of time needed to remove left-over precursors.

Accordingly, there is a need in the art for apparatus and methods to improve ALD cycle times by improving pump and/or purge efficiency.

SUMMARY

One or more embodiments of the disclosure are directed to process chamber lids comprising a pumping liner, a showerhead, a gas funnel and a purge ring. The pumping liner has a body with an inner wall, an outer wall, a top wall and a bottom wall. The inner wall extends around a central axis spaced a first distance from the central axis to form an open central region. The showerhead is positioned within the open central region of the pumping liner. The showerhead has a front surface and a back surface defining a thickness with a plurality of apertures extending through the thickness. The gas funnel is positioned within the open central region of the pumping liner. The gas funnel has a front surface and sidewalls. The front surface is spaced a distance from the back surface of the showerhead to form a gap. The sidewalls are in contact with the inner wall of the pumping liner to form a plenum. The gas funnel has an opening extending through the back surface to the front surface and a plurality of apertures extending from the front surface to the back surface of the gas funnel. The apertures extend from a common area adjacent the back surface of the gas funnel to the front surface spaced between the front surface and the opening of the gas funnel. The purge ring has a ring shaped body with an inner peripheral edge, an outer peripheral edge, a top surface and a bottom surface defining a thickness of the body. The purge ring is positioned within the open central region of the pumping liner. The bottom surface of the purge ring is in contact with the back surface of the gas funnel. A circular channel is formed in the bottom surface of the purge ring body positioned adjacent the common area of the apertures in the gas funnel. At least two openings extend from the top surface of the body to the top surface of the circular channel.

Further embodiments of the disclosure are directed to processing methods comprising: flowing an inert gas into a process region of a process chamber through a gas funnel positioned within an open central region of a pumping liner and spaced a distance from a showerhead so that there is a gap between a front surface of the gas funnel and a back surface of the showerhead, the gas funnel having an opening extending through the back surface to the front surface and a plurality of apertures extending from the front surface to the back surface, the apertures extending from a common area adjacent the back surface to the front surface; and removing gases from the process region by providing vacuum to the pumping liner and the plurality of apertures in the gas funnel through a purge ring positioned adjacent the back surface of the gas funnel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The shading of portions and components in the drawings are for descriptive purposes and are not intended to indicate materials of construction.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Some embodiments of the disclosure provide process chamber lids and techniques to enable fast pumping to reduce cycle time and increase throughput. Some embodiments of the present disclosure provide uniform gas distribution is achievable through proper precursor delivery and pumping. In some embodiments, the process chamber lid incorporates a purge enhancement module (PEM) configured to provide uniform gas delivery. In some embodiments, uniform gas delivery is provided through a mixer design and uniform pumping is achieved via a tunable pumping liner and PEM module design. Some embodiments of the disclosure advantageously provide gas delivery tuning and gas pumping tuning.

Some embodiments of the disclosure provide process chamber lids with purge enhancement modules to reduce cycle time by removing residual precursor(s) from the backside of the showerhead. Some embodiments of the disclosure provide PEMs with fast cycle pumping. Some embodiments provide additional pumping to the upstream side of the showerhead.

One or more embodiments of the process chamber lid enables a flexible plenum design comprised of a one-piece pumping liner and a funnel. The purge enhancement module of some embodiments includes a cap with a heater element which can be removable or integrated. Some embodiments provide a tunable pumping design which is easy to refurbish or retrofit because it is comprised of separable components.

In some embodiments, the process chamber lid includes a pumping liner with a two-piece plenum for efficient refurbishment due to no dead volumes. The plenum of some embodiments can be configured with baffles to reduce side-to-side pumping patterns due to exhaust port positioning.

In some embodiments, the pumping module includes a plurality (e.g., 72) pumping holes on the funnel and the plenum in the pumping cap. The separate plenum entities of some embodiments allow components to be individually removed and replaced. Some embodiments of the plenum modules enable efficient refurbishment or replacement due to no dead volumes.

In some embodiments, the process chamber lid incorporates a lid heater design which can be integrated into the plenum module, pumping plenum cap or separated into a removable heater. The removable nature of the heater in some embodiments reduces the cost of refurbishment or replacement. In some embodiments, the major sealing surfaces are backed up with differential pumping to reduce the likelihood of atmospheric gas diffusion into the process cavity.

Figure 1:
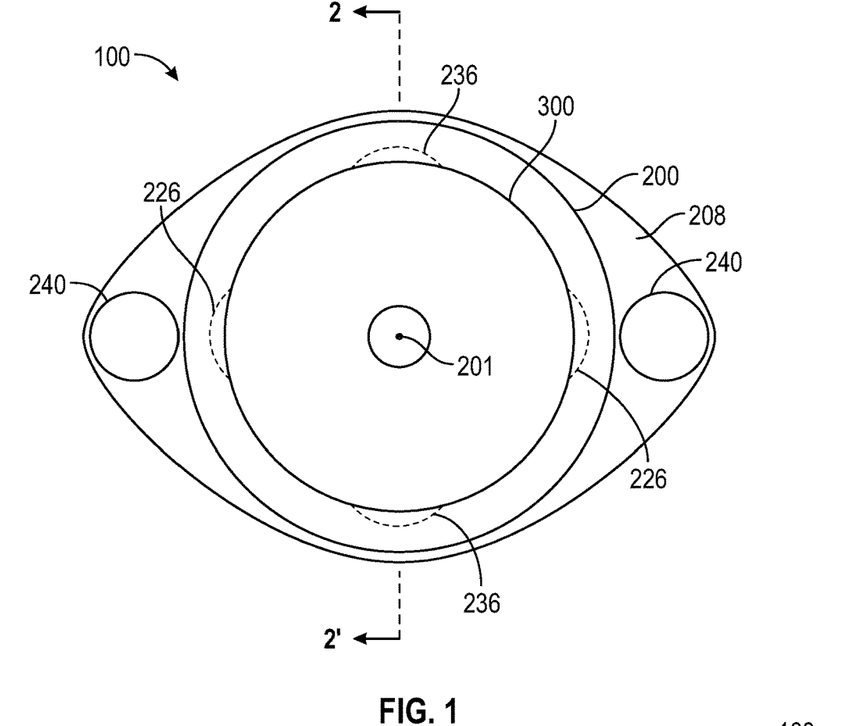
FIG. 1 shows a top view of a process chamber lid according to one or more embodiment of the disclosure.
Figure 2:
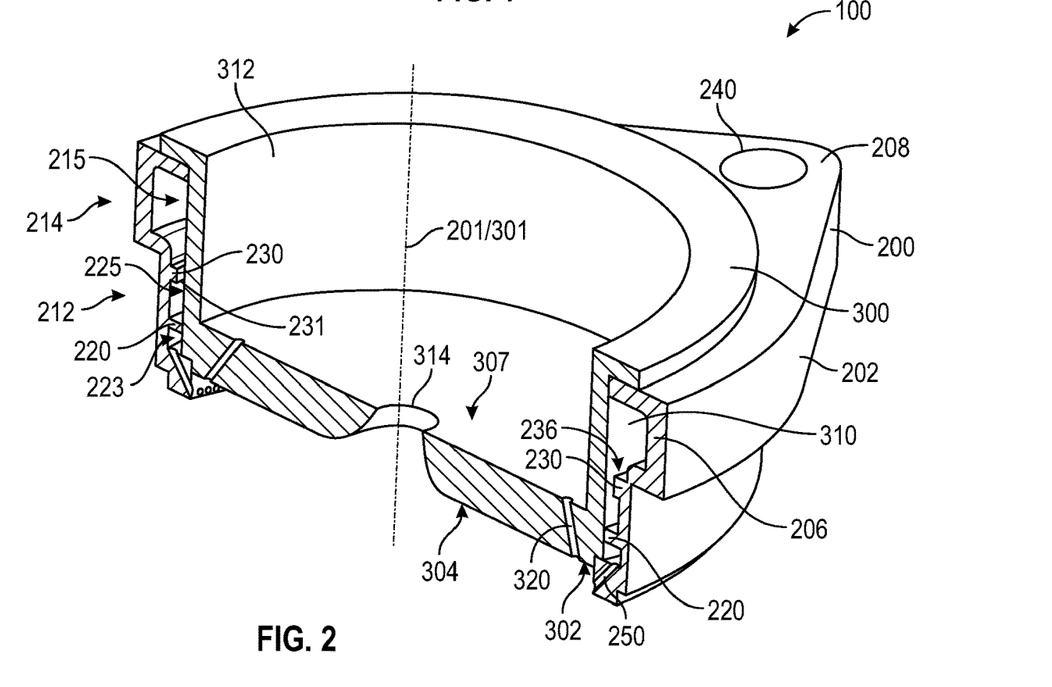
FIG. 2 shows a cross-sectional isometric view of a portion of a process chamber lid according to one or more embodiment of the disclosure.

FIG. 1 illustrates a top view of a process chamber lid 100 according to one or more embodiment of the disclosure. The lid 100 illustrated in FIG. 1 includes a pumping liner 200 and a gas funnel 300. FIG. 2 illustrates a cross-sectional view of the lid 100 of FIG. 1 taken along line 2-2'. Other components of the process chamber lid 100 are illustrated and discussed below.

Figure 3:
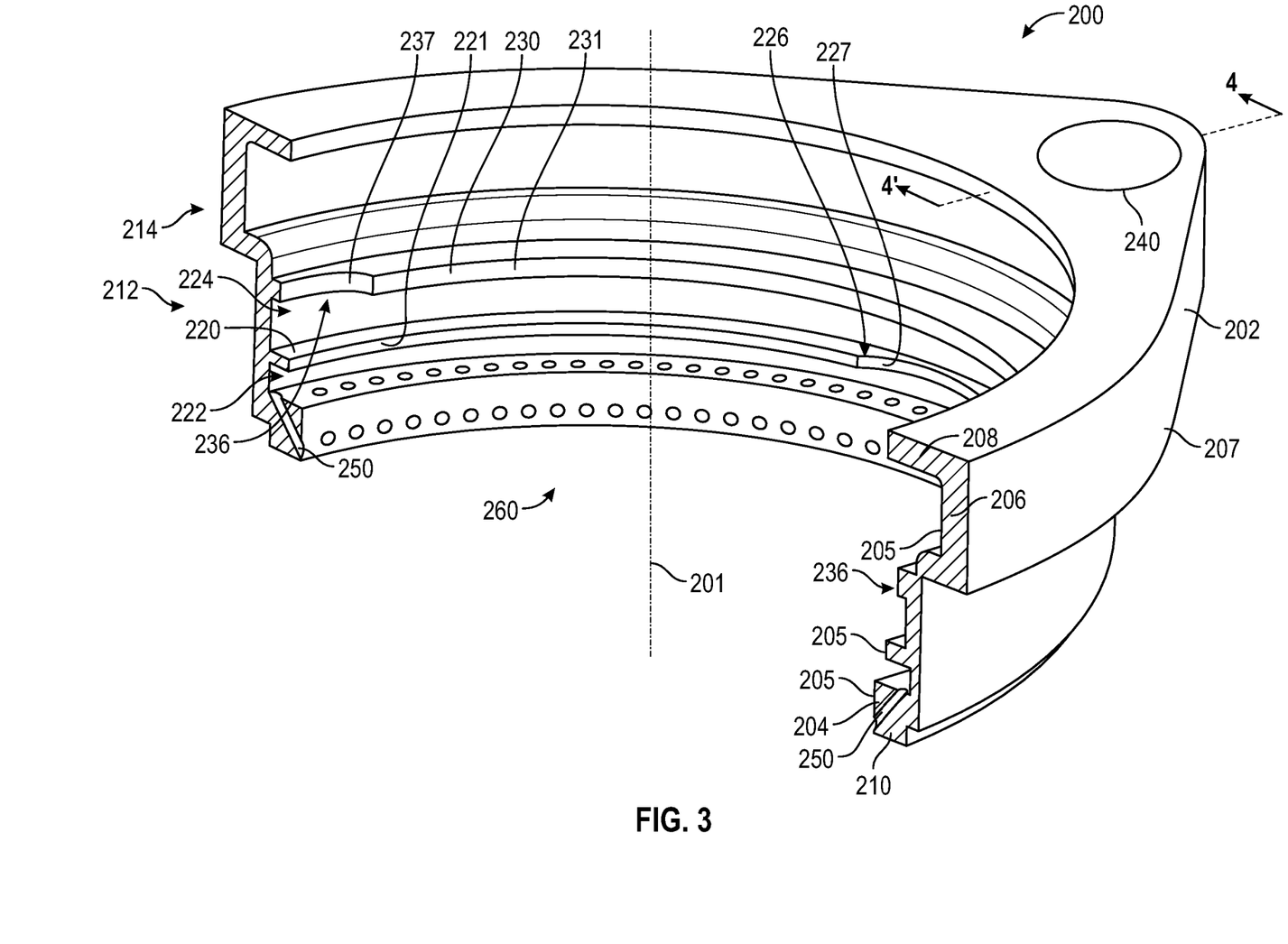
FIG. 3 shows a cross-sectional isometric view of a pumping liner according to one or more embodiment of the disclosure.
Figure 4:
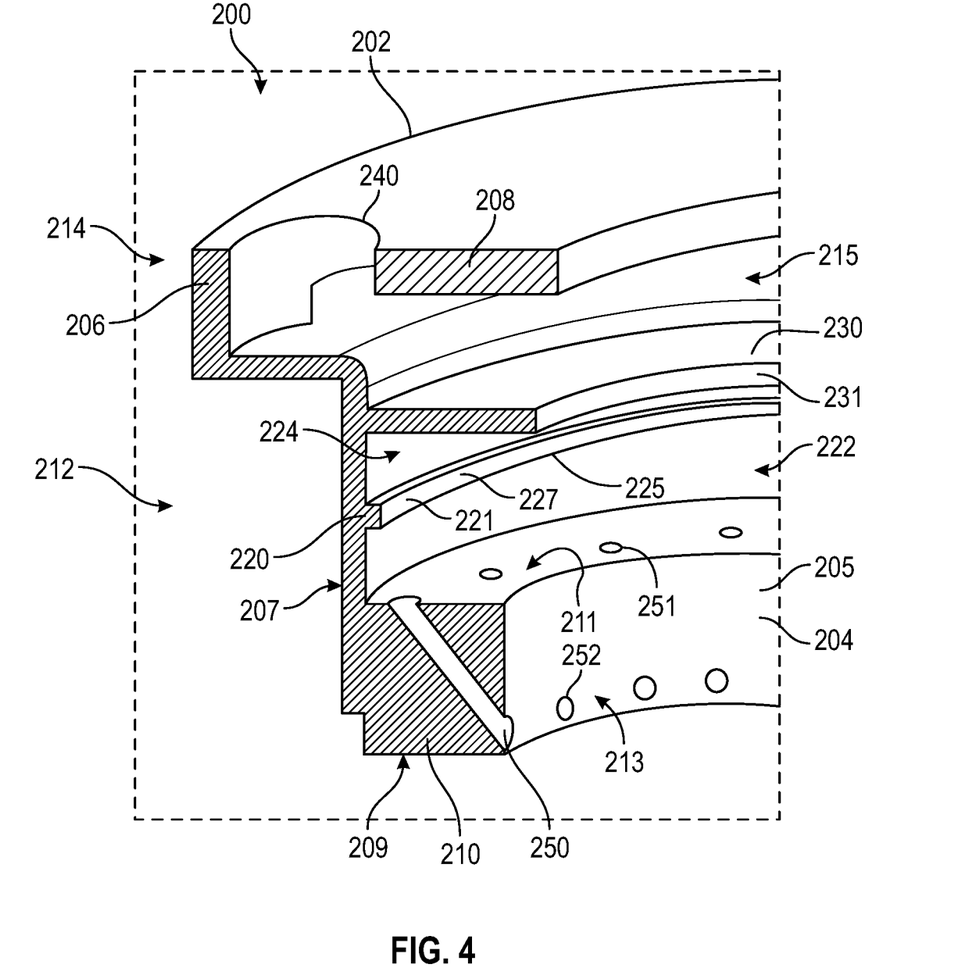
FIG. 4 shows a cross-sectional isometric view of a portion of a pumping liner according to one or more embodiment of the disclosure.

FIG. 3 illustrates a cross-sectional view of the pumping liner 200 shown in FIGS. 1 and 2 taken along line 2-2'. FIG. 4 shows a cross-sectional view of the pumping liner 200 taken along line 4-4' in FIG. 3.

Referring to FIGS. 3 and 4, the pumping liners 200 have a body 202 with any suitable shape. In some embodiments, as shown in the Figures, the body 202 has a generally cylindrical body with a prolate upper portion. However, the skilled artisan will recognize that the pumping liner 200 can have any suitable shape depending on, for example, the process chamber lid in which the liner will be used.

The body 202 of the pumping liner 200 has an inner wall 204, an outer wall 206, a top wall 208 and a bottom wall 210. The inner wall 204 of some embodiments has a variable shape to form separate plenums when the liner 200 is paired with the funnel 300, or other suitable component. The inner wall 204 has an inner face 205 that extends around the central axis 201 of the body 202 and is spaced a distance from the central axis 201. The distance that the inner face 205 is spaced a first distance from the central axis 201 varies with position between the top wall 208 and the bottom wall 210 to form the baffles and plenums described herein. The outer face 207 extends around the inner face 205 and is spaced a second distance from the central axis 201. At any location between the top wall 208 and the bottom wall 210, the difference between the first distance and the second distance defines the thickness of the sidewall of the body 202.

The body 202 includes a first baffle 220 in the lower portion 212 of the body 202. The first baffle 220 forms a boundary defining a first plenum 222 region and a second plenum region 224. When the pumping liner 200 is positioned as shown in FIG. 2, the first plenum region 222 becomes a first plenum 223 and the second plenum region 224 becomes a second plenum 225. The first baffle 220 is positioned a first distance from the bottom wall 210 and extends inwardly from the inside surface of the outer wall 206 to an inner face 221 of the first baffle 220. The inner face 221 of the first baffle 220 is spaced a distance from the central axis 201.

The first baffle 220 has at least one irregularity 226 formed therein. The irregularity 226 is any opening or combination of openings that provide fluid communication between the first plenum region 222 and the second plenum region 224, or between the first plenum 223 and the second plenum 224. The irregularity 226 in the first baffle 220 is visible in FIGS. 3 and 4, but cannot be seen in FIG. 2. The irregularity 226 is indicated by a dotted line in FIG. 1 to illustrate an exemplary location of the irregularity 226.

The irregularity 226 of some embodiments comprises a slot or notch in the inner face 221 of the first baffle 220. In some embodiments, the irregularity has an inner face 227 positioned a greater distance from the central axis 201 than the inner face 221 of the first baffle 220. In some embodiments, the irregularity 226 comprises one or more opening through the first baffle 220 without interrupting the uniformity of the inner face 221.

Some embodiments include a second baffle 230 in the lower portion 212 of the body 202. The second baffle 230 defines a boundary separating the upper portion 214 from the lower portion 212. The second baffle 230 of some embodiments defines a boundary of the second plenum region 224. The second baffle 230 is positioned a second distance from the bottom wall 210 that is greater than the first distance of the first baffle 220. The second baffle 230 extend inwardly from the inside surface of the outer wall 206 to an inner face 231 of the second baffle 230. The inner face 231 of the second baffle 230 is spaced a distance from the central axis 201.

The second baffle 230 has at least one irregularity 236 formed therein. The irregularity 236 is any opening or combination of openings that provide fluid communication between the second plenum region 224 and the upper portion 214. The irregularity 236 in the second baffle 230 is visible in FIGS. 2 and 3, but cannot be seen in FIG. 4. The irregularity 236 is indicated by a dotted line in FIG. 1 to illustrate an exemplary location of the irregularity 236.

The irregularity 236 of some embodiments comprises a slot or notch in the inner face 231 of the second baffle 230. In some embodiments, the irregularity 236 has an inner face 237 positioned a greater distance from the central axis 201 than the inner face 231 of the second baffle 230. In some embodiments, the irregularity 236 comprises one or more opening through the second baffle 230 without interrupting the uniformity of the inner face 231.

In some embodiments, as illustrated in the Figures, the outer wall 206 of the upper portion 214 is further from the central axis 201 than the outer wall 206 of the lower portion 212.

In some embodiments the upper portion 214 of the body 202 comprises at least one exhaust port 240. The exhaust port 240 provides fluid communication with the upper portion 214, or the upper plenum 215 through the top wall 208. In the embodiment illustrated in the Figures, the body 202 comprises two exhaust ports 240. The skilled artisan will recognize that there can be any suitable number of exhaust ports 240.

In some embodiments, the pumping liner 200 of comprises two exhaust ports 240 positioned about 180° apart relative to the central axis 201. Being spaced apart relative to the central axis means that the stated components are at different rotational positions based on the central axis, the distance from the central axis can be the same or different. In some embodiments, there are three exhaust ports 240 positioned about 120° apart relative to the central axis 201. In some embodiments, there are four exhaust ports 240 positioned about 90° apart relative to the central axis 201.

The first baffle 220 and the second baffle 230 are positioned to increase flow uniformity in the exhaust. The irregularities are positioned so that there is no direct path between the exhaust port 240 and the bottom wall 210. In some embodiments, the irregularity 236 in the second baffle 230 is offset from the irregularity 226 in the first baffle 220. In some embodiments the irregularity 236 in the second baffle 230 is positioned at least about 90° around the central axis from the irregularity 226 in the first baffle 220.

In some embodiments, there are two irregularities 226 in the first baffle 220 and two irregularities 236 in the second baffle 230. In some embodiments, the irregularities 226 in the first baffle 220 are offset from the irregularities 236 in the second baffle 230. In some embodiments, the two irregularities 226 in the first baffle 220 are centered about 180° apart relative to the central axis 201. As used in this manner, the "center" of the irregularities is the average angular position of the irregularity weighted for the gas conductance. For example, a symmetrically shaped uniformity (e.g., a circular opening) has the gas conductance weighted average angular position equal to the physical center of the uniformity. In a non-symmetrically shaped uniformity (e.g., an ovoid shaped opening) the gas conductance weighted average angular position may be offset from the physical center of the uniformity. In some embodiments, the two irregularities 236 in the second baffle 230 are centered about 180° apart relative to the central axis 201. In some embodiments, each of the irregularities are centered greater than or equal to about 80° apart relative to the central axis from other irregularities.

In some embodiments, there are no irregularities 236 in the second baffle 230 within about 45° of an exhaust port 240, relative to the central axis. In some embodiments, there are two irregularities 236 in the second baffle 230 with each of the irregularities 236 centered about 90° relative to the central axis from an exhaust port 240.

In some embodiments, there are two irregularities 226 in the first baffle 220 with each irregularity 226 having a center aligned with an exhaust port 240. As used in this manner, an irregularity is aligned with the exhaust port when the center of the irregularity is within ±10° of the exhaust port 240 relative to the central axis 201.

In some embodiments, as shown in the Figures, the outer wall 206 of the upper portion 214 adjacent an exhaust port 240 is further from the central axis 201 than the outer wall 206 of the upper portion 214 about 90° relative to the central axis 201 from the exhaust port 240. Stated differently, in some embodiments, the width (measured from the central axis) of the upper plenum 215 is greater at the exhaust ports 240 than at about 90° from the exhaust ports 240. In some embodiments, the width of the upper plenum 215 varies gradually from a local maximum at the exhaust port 240 to a local minimum at the maximum distance from an exhaust port 240. For example, in a symmetrical system in which the exhaust ports are exactly 180° apart, the width of the plenum 215 90° from the exhaust port 240 is a local minimum.

In some embodiments, the bottom wall 210 comprises a plurality of apertures 250 extending through the bottom wall 210. Referring to FIG. 4, the bottom wall 210 extends from the bottom surface 209 of the body 202 to the bottom surface 211 of the first plenum region 222. The apertures 250 extend from a plenum opening 251 in the bottom surface 211 of the first plenum region 222 to a bottom opening 252 in the bottom surface 209 or bottom inner surface 213 of the bottom wall 210. In some embodiments, the apertures are angled from an upper end to a lower end of the aperture so that the plenum opening 251 is further from the central axis 201 than the bottom opening 252.

Figure 5:
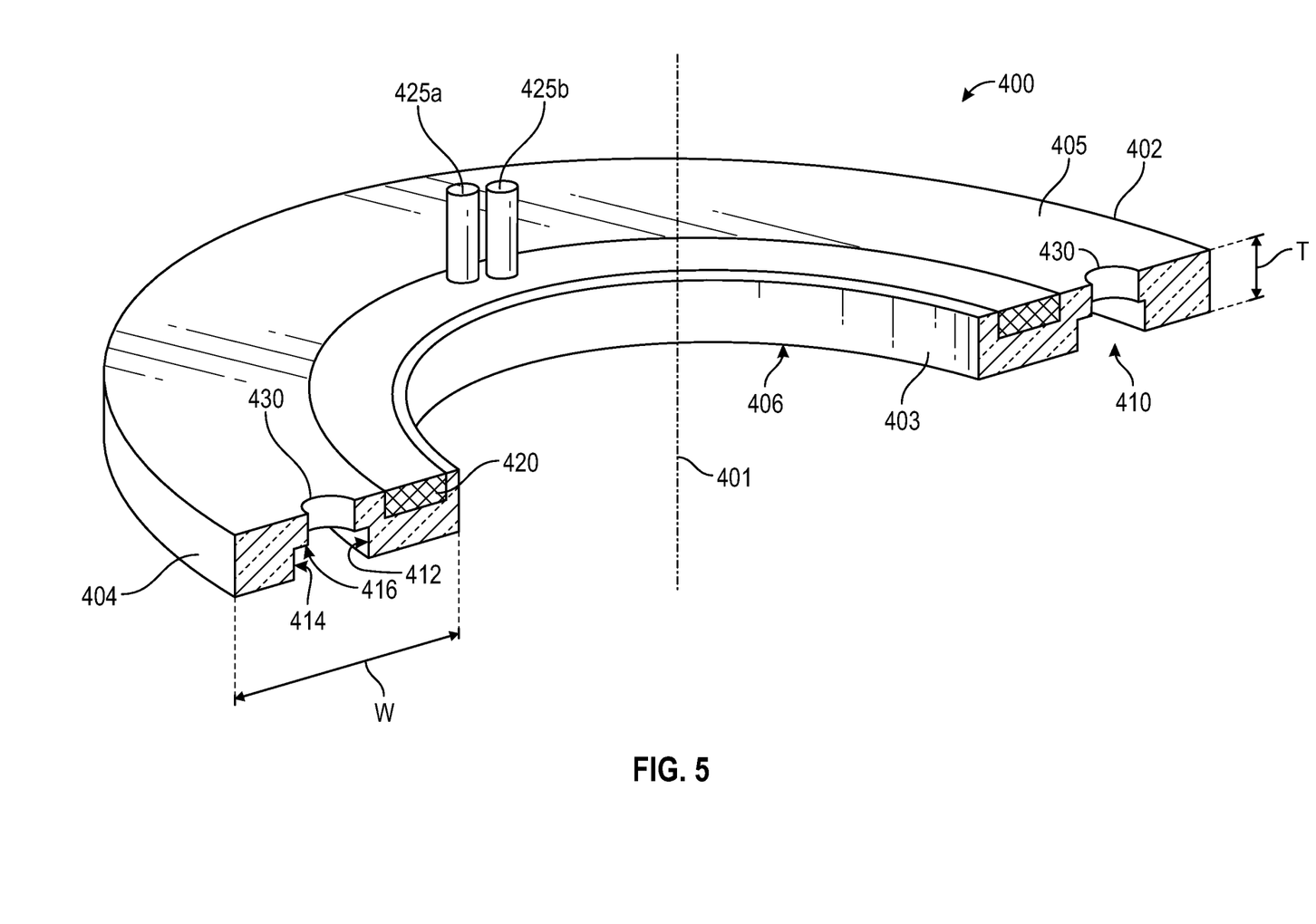
FIG. 5 shows a cross-sectional isometric view of a purge ring according to one or more embodiment of the disclosure.

Referring to FIG. 5, some embodiments of the disclosure are directed to purge rings 400. The purge ring 400 has a ring shaped body 402 extending around a central axis 401. The body 402 has an inner peripheral edge 403, an outer peripheral edge 404, a top surface 405 and a bottom surface 406. Inner peripheral edge 403 and outer peripheral edge 404 define a width W of the body 402 and the top surface 405 and bottom surface 406 define a thickness T of the body 402.

A circular channel 410 is formed in the bottom surface 406 of the body 402. The channel 410 has an inner peripheral edge 412, an outer peripheral edge 414 and a top surface 416. The channel 410 illustrated has a generally rectangular shaped cross-section. The disclosure is not limited to rectangular shaped cross-sectional channels 410. In some embodiments, the channel 410 is ovoid shaped or shaped without a hard corner. At least one opening 430 forms a fluid connection between the channel 410 and the top surface 416 to allow a flow of gas (or vacuum) to pass between the channel 410 and a component adjacent the top surface 416.

In some embodiments, a thermal element 420 is within the body 402. In some embodiments, as illustrated, the thermal element 420 is formed in the top surface 405 of the body 402. In some embodiments, the thermal element 420 is formed within the thickness of the body 402 so that the thermal element is not exposed through the top surface 405 or the bottom surface 406. In some embodiments the thermal element 420 is positioned closer to the central axis 401 of the body 402 than the circular channel 410, as illustrated in FIG. 5. In some embodiments, connections 425*a*, 425*b* are connected to the thermal element 420. The connections 425*a*, 425*b* can be any suitable connection depending on the type of thermal element 420. For example, for a resistive heater, the connections 425*a*, 425*b* of some embodiments are electrodes.

In some embodiments, the thermal element 420 is a part of the purge ring 400. In some embodiments, the thermal element 420 is a separate component from the purge ring 400.

Figure 6:
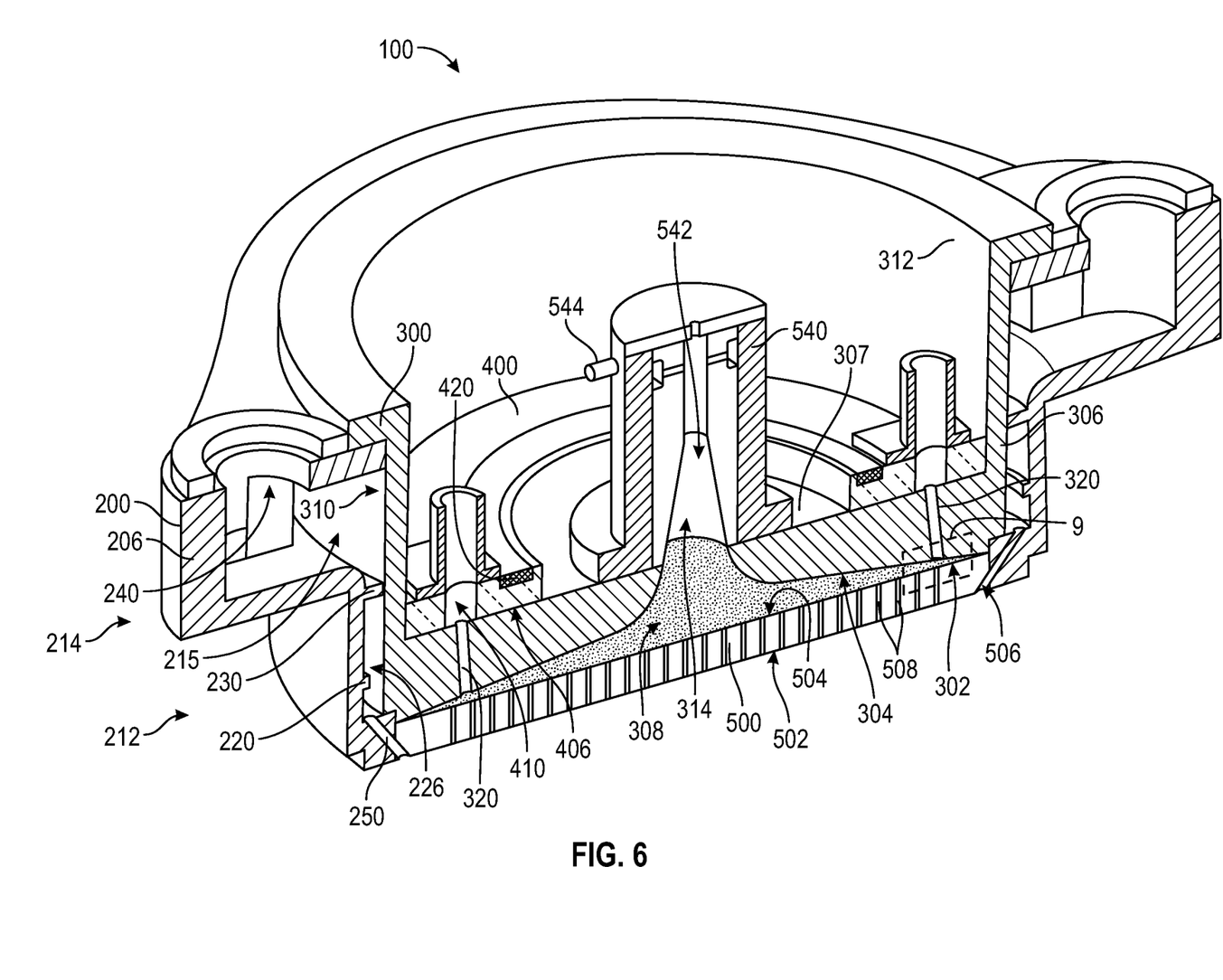
FIG. 6 shows a cross-sectional isometric view of a process chamber lid according to one or more embodiment of the disclosure.
Figure 7:
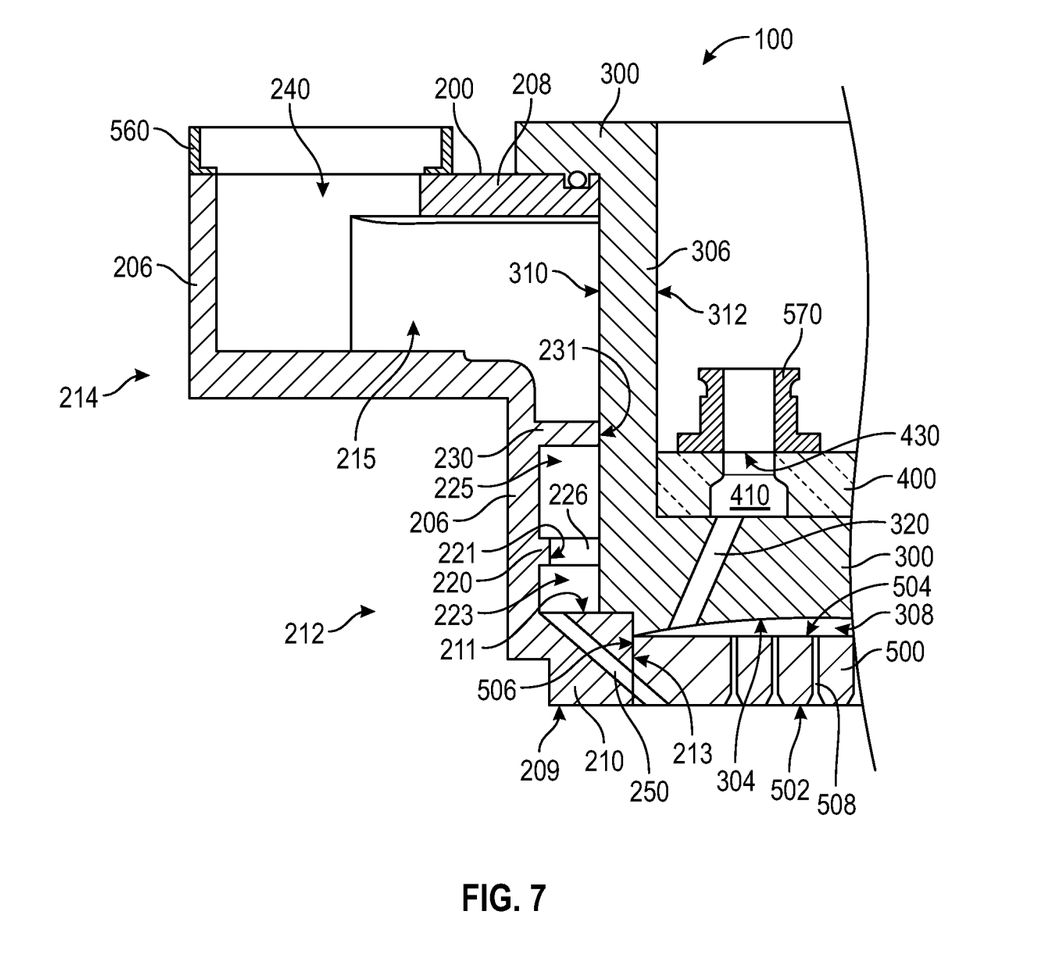
FIG. 7 shows a cross-sectional isometric view of a portion of a process chamber lid according to one or more embodiment of the disclosure.
Figure 8:
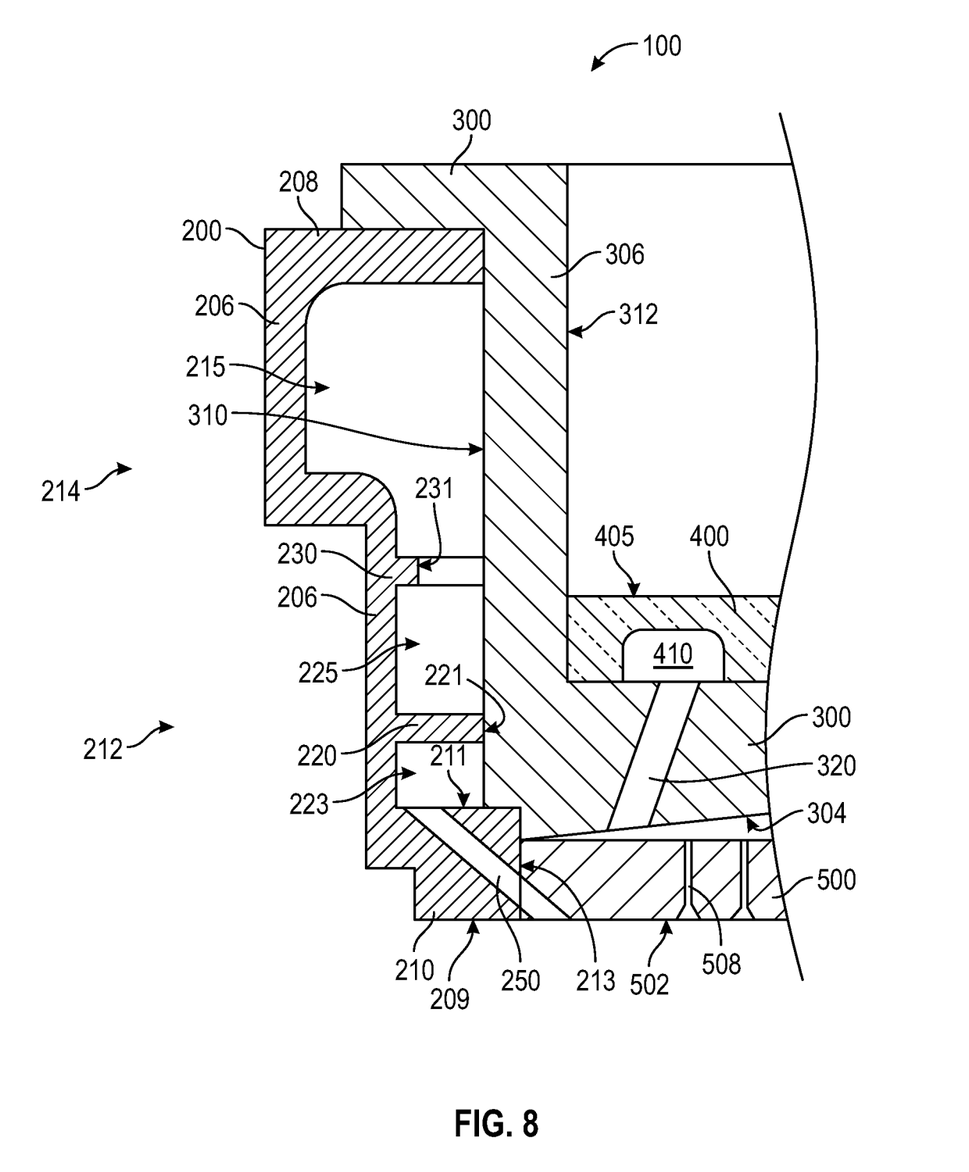
FIG. 8 shows a cross-sectional isometric view of a portion of a process chamber lid according to one or more embodiment of the disclosure.

Referring to FIGS. 6 through 8, some embodiments of the disclosure are directed to process chamber lids 100. The process chamber lid 100 includes a pumping liner 200 and a gas funnel 300, as described above. In some embodiments, the lid 100 further comprises a purge ring 400, as described above.

In some embodiments, the lid 100 further comprises a showerhead 500 in the open central region 260 of the pumping liner 200. The showerhead 500 of some embodiments is positioned within the lower portion 212 of the open central region 260 of the pumping liner 200. The showerhead 500 has a front surface 502 and a back surface 504 defining a thickness of the showerhead 500, and an outer peripheral edge 506. A plurality of apertures 508 extend through the thickness of the showerhead 500 and have openings in the front surface 502 and the back surface 504. In some embodiments, the outer peripheral edge 506 of the showerhead has an angled surface aligned with the opening 250 in the bottom wall 210 of the pumping liner 200. The showerhead 500 can be any suitable showerhead known to the skilled artisan with any suitable number of apertures 508 arranged in any suitable configuration.

The gas funnel 300 is positioned within the open central region 260 of the pumping liner 200. The gas funnel 300 has a front edge 302 with a front surface 304, sidewalls 306 and a back surface 307. The front edge 302 of some embodiments contacts the back surface 504 of the showerhead 500 at the outer peripheral region of the showerhead.

Figure 9:
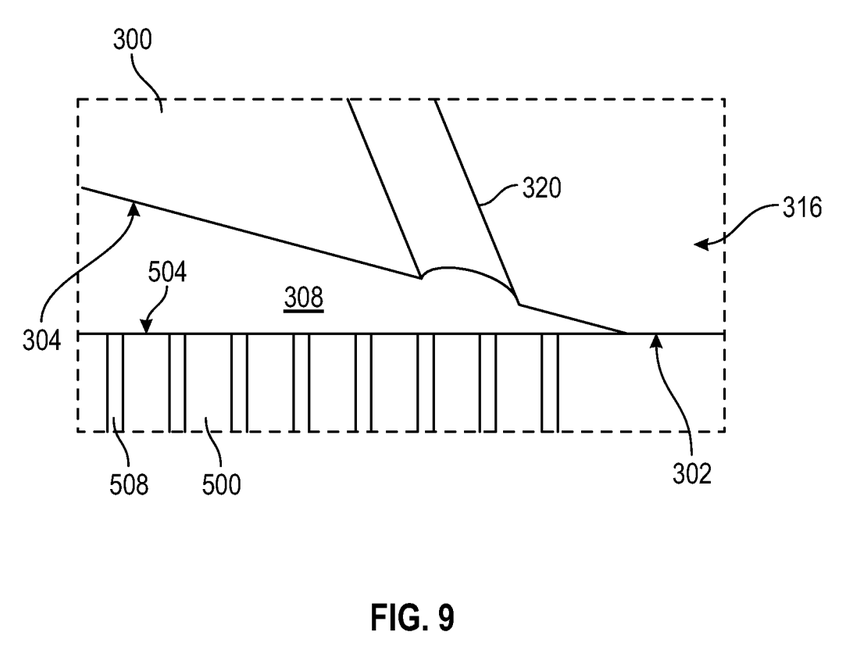
FIG. 9 shows an expanded view of region 9 in FIG. 6.

The front surface 304 of some embodiments is spaced a distance D from the back surface 504 of the showerhead to form a gap 308. In some embodiments, the gap 308 has a uniform dimension from edge to edge of the funnel 300. In some embodiments, as shown in FIGS. 6 and 9, the front surface 304 of the gas funnel 300 has an inverted funnel-like shape with a larger gap 308 adjacent the central axis 301 of the funnel 300 than adjacent the front edge 302 near the outer peripheral region 316.

The sidewalls 306 have an outer face 310 and an inner face 312. The outer face 310 of the sidewalls 306 contact the inner wall 304 of the pumping liner 200. The outer face 310 of the sidewalls 306 is in contact with the inner face 221 of the first baffle 220 and the inner face 231 of the second baffle 230 to form the outer boundary of the first plenum 223 and second plenum 225.

The gas funnel 300 has an opening 314 extending through the back surface 307 to the front surface 304. The opening 314 of some embodiments is symmetrical around the central axis 301.

Referring to FIGS. 6 through 9, some embodiments of the gas funnel 300 include a plurality of apertures 320 extending from the front surface 304 to the back surface 307. The apertures 320 are spaced adjacent to the outer peripheral edge 316 of the front surface 304 of the gas funnel 300. In some embodiments, the apertures are angled inwardly so that the opening of the aperture 320 in the front surface 304 is further from the central axis 301 than the opening of the aperture 320 in the back surface 307. The number, size and spacing of apertures 320 in the gas funnel 300 can be varied. In some embodiments, there are greater than or equal to about 48 apertures 320 equally spaced around the outer peripheral region of the funnel 300.

Referring again to FIGS. 6 through 8, some embodiments of the lid 100 include a purge ring 400 as described above with respect to FIG. 5. The purge ring 400 of some embodiments is positioned within the open central region 260 of the pumping liner 100. The bottom surface 406 of the purge ring 400 of some embodiments is in contact with the back surface 307 of the gas funnel 300. As used in this manner, the term "in contact with" means that the components are physically touching, or are close enough to form a fluid tight seal, for example, using one or more o-rings.

FIG. 7 illustrates a partial cross-sectional view of a process chamber lid 100. The cross-section is illustrated at an equivalent position to line 4-4', similar to that shown in FIG. 4 with additional components. The embodiment illustrated in FIG. 7 shows a cross-sectional portion of the lid 100 taken along a line extending through an exhaust port 240. FIG. 8 illustrates a partial cross-sectional view of a process chamber lid 100 at an equivalent position to line 2-2', similar to that shown in FIG. 2 with additional components. The embodiment illustrated in FIG. 8 shows a portion of the lid 100 in a region without an exhaust port. The embodiments illustrated include a pumping liner exhaust connector 560 in fluid communication with the upper plenum 215 through exhaust port 240, and a purge ring exhaust connector 570 in fluid communication with the channel 410 and opening 430 in the purge ring 400.

Some embodiments of the lid 100 include a mixing chamber 540 in fluid communication with the opening 314 in the gas funnel 300. The mixing chamber 540 of some embodiments has a funnel shaped opening 542 aligned with the opening 314 of the gas funnel 300 and one or more gas injectors 544 to provide a flow of gas into the mixing chamber 540.

Some embodiments of the disclosure contain purge enhancement module (fast cycle pumping) to remove residual precursor quickly. Some embodiments can reduce cycle time significantly. Similar techniques can be implemented for pump-purge technique for VNAND ALD deposition adding more azimuthal rows of holes. Some embodiments provide lower cycle time with improved throughput. Some embodiments provide tunable plenum conductance that can be easily modified by changing a portion of the process chamber lid or the top plate only.

Embodiments of the design includes a number of holes (e.g., 72, more or less can be used) around the circumference of a funnel profile. A top plate is attached on the lid with outer and inner (can be dual seals) seals. The top plate of some embodiments contains circular channels for uniform flow distribution. In some embodiments, a number of dump valves (e.g., 2) are installed on the top plate to enable two exhaust lines merged into single foreline. A dump valve is operated simultaneously during pump-purge operation in some embodiments. In some embodiments, a heater is added with power capacity up to 3200 W (or higher). In some embodiments, the design contain additional azimuthal rows to enable pump-purge technique for VNAND deposition application Referring to FIG. 10, one or more embodiment of the disclosure is directed to process chamber lids including a gas funnel 300 positioned within the open central region of the pumping liner 200. The gas funnel 300 includes a plurality of apertures 320 extending from the back surface 307 to the front surface 304. In some embodiments, as shown in FIG. 10, the plurality of apertures 320 extend from a common area 360 adjacent the back surface 307 and separate into different apertures 320.

Figure 10:
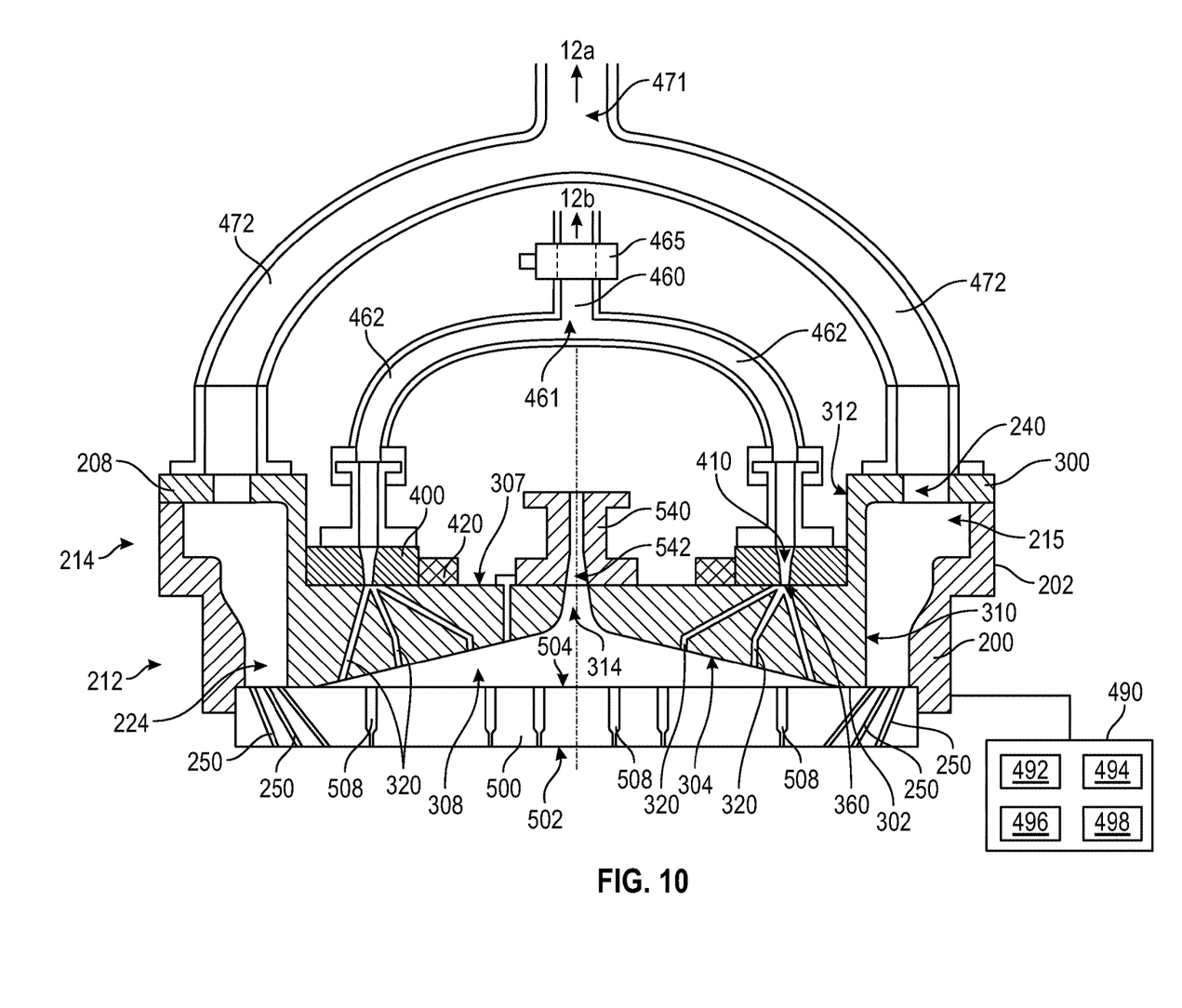
FIG. 10 shows a cross-sectional view of a process chamber lid according to one or more embodiment of the disclosure.

The common area 360 illustrated in FIG. 10 is a recessed portion formed in the back surface of the gas funnel. In some embodiments, the common area 360 is the channel 410 formed in the purge ring 400 and the openings in the back surface 307 of the gas funnel are staggered.

Figure 11:
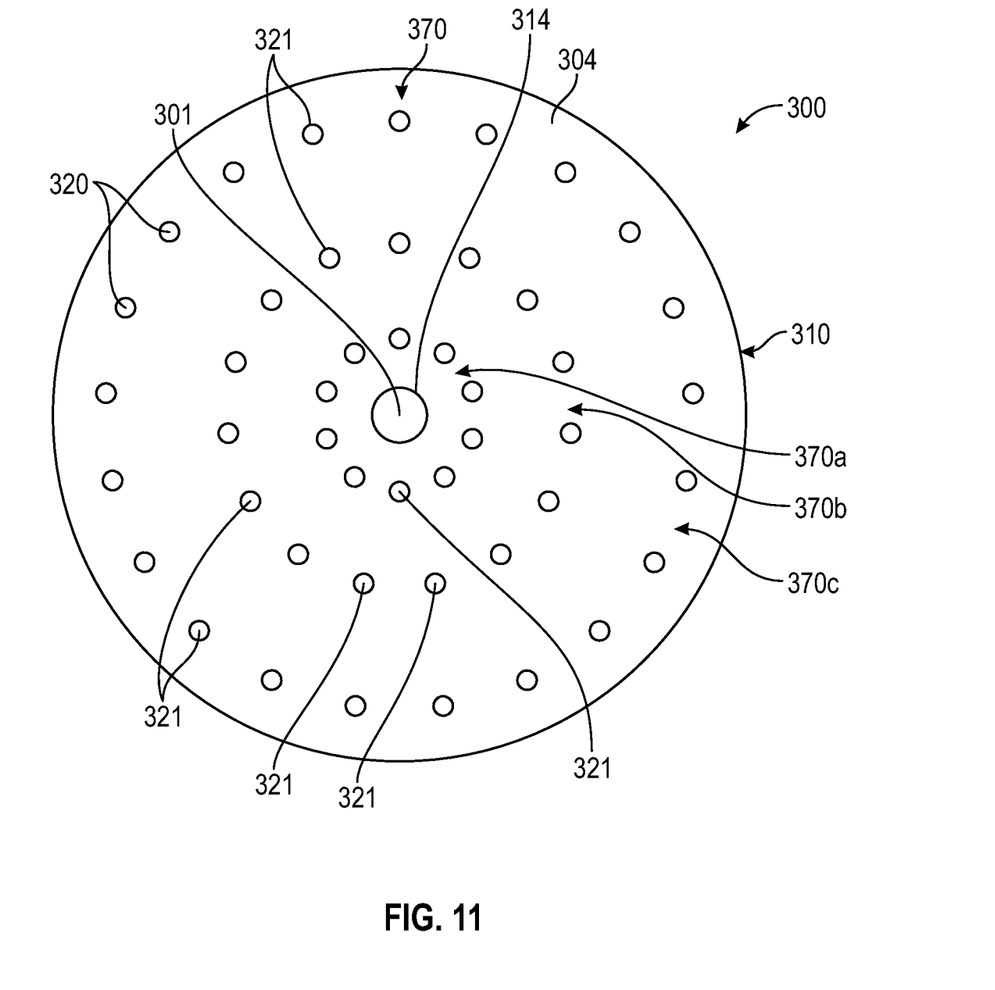
FIG. 11 shows a front view of a gas funnel in accordance with one or more embodiment of the disclosure.

In some embodiments, as shown in FIG. 11, the plurality of apertures 320 in the gas funnel 300 are separated into radial zones 370. FIG. 11 shows the front surface 304 of a gas funnel 300 in accordance with one or more embodiment of the disclosure. Each of the radial zones 370a, 370b, 370c is located at a different distance from the central axis 301 and each radial zone 370 has a plurality of openings 321 in the front surface 304 of the gas funnel 300. In some embodiments, each of the radial zones 370 comprises a plurality of apertures extending around the central axis 301 in a circular pattern. The number of apertures 320 and/or openings 321 in each radial zone 370 is in the range of 30 to 1600.

Figure 12:
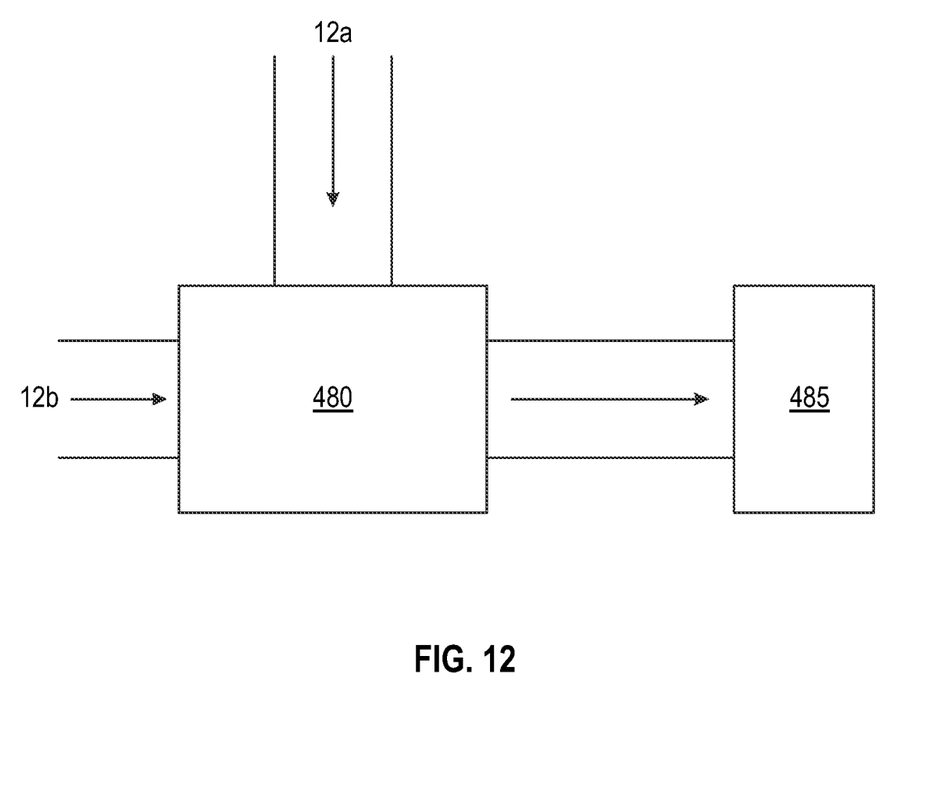
FIG. 12 shows a schematic representation of an exhaust system for use with one or more embodiments of the disclosure.

Referring to FIGS. 10 and 12, some embodiments incorporate a purge ring exhaust line 460. In some embodiments, the purge ring exhaust line 460 splits at a junction 461 into at least two legs 462. Each leg 462 is connected to one of the at least two openings 410 in the purge ring 400 to an exhaust (e.g., vacuum pump, foreline) downstream of the junction 461. In some embodiments, purge ring exhaust line 460 comprises a dump valve 465 located downstream of junction 461 and upstream of the exhaust.

Some embodiments further comprise a plenum exhaust line 470 connecting the plenum 215 to exhaust (e.g., vacuum pump, foreline). In some embodiments, there are two openings 240 in the plenum 215 and each opening 240 is in fluid communication with an end 472 of the plenum exhaust line 470. The ends 472 of the plenum exhaust line 470 of some embodiments are connected at a plenum exhaust junction 471.

The plenum exhaust line 470 has a flow indicated by numeral 12a and the purge ring exhaust line 460 has a flow indicated by numeral 12b. The flows 12a, 12b from the embodiment illustrated in FIG. 10, join at a union 480 downstream of the dump valve 465 of the purge ring exhaust line 460. In some embodiments, the union 480 comprises a valve that controls a flow amount from each of the plenum exhaust line and the purge ring exhaust line to exhaust 485.

In some embodiments, the process chamber lid further comprises a controller 490 configured to control a flow of gas into the opening 314 in the gas funnel 300 and out of the gap 308 between the gas funnel 300 and the showerhead 500 through the plurality of apertures 508 in the showerhead 500.

In some embodiments, at least one controller 490 is coupled to one or more components (e.g., valves, flow regulators, mass flow controllers, actuators, etc.) to provide flows of gases into and out of the process region of the chamber. In some embodiments, there are more than one controller 490 connected to the individual components and a primary control processor is coupled to each of the separate controllers to control the system. The controller 490 may be one of any form of general-purpose computer processor, microcontroller, microprocessor, etc., that can be used in an industrial setting for controlling various chambers and sub-processors.

The at least one controller 490 can have a processor 492, a memory 494 coupled to the processor 492, input/output devices 496 coupled to the processor 492, and support circuits 498 to communication between the different electronic components. The memory 494 can include one or more of transitory memory (e.g., random access memory) and non-transitory memory (e.g., storage).

The memory 494, or computer-readable medium, of the processor may be one or more of readily available memory such as random access memory (RAM), read-only memory (ROM), floppy disk, hard disk, or any other form of digital storage, local or remote. The memory 494 can retain an instruction set that is operable by the processor 492 to control parameters and components of the system. The support circuits 498 are coupled to the processor 492 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 490 has one or more configurations to execute individual processes or sub-processes to perform the method. The controller 490 can be connected to and configured to operate intermediate components to perform the functions of the methods. For example, the controller 490 can be connected to and configured to control one or more of gas valves, actuators, motors, slit valves, vacuum control, etc.

The controller 490 of some embodiments has one or more configurations selected from: a configuration to control a flow of gas through the apertures in the showerhead into the gap between the gas funnel and the showerhead and out of the gap through the plurality of apertures in the gas funnel; a configuration to meter the flow of gas through the dump valve; and/or a configuration to meter the flows of gases through the plenum exhaust line and the purge ring exhaust line.

Some embodiments are directed to processing methods comprising flowing an inert gas into a process region of a process chamber through a gas funnel positioned within an open central region of a pumping liner and spaced a distance from a showerhead so that there is a gap between a front surface of the gas funnel and a back surface of the showerhead, the gas funnel having an opening extending through the back surface to the front surface and a plurality of apertures extending from the front surface to the back surface, the apertures extending from a common area adjacent the back surface to the front surface; and removing gases from the process region by providing vacuum to the pumping liner and the plurality of apertures in the gas funnel through a purge ring positioned adjacent the back surface of the gas funnel.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A processing method comprising:
    flowing an inert gas into a process region of a process chamber through a gas funnel positioned within an open central region of a pumping liner and spaced a distance from a showerhead so that there is a gap between a front surface of the gas funnel and a back surface of the showerhead, the gas funnel having an opening extending through the back surface to the front surface and a plurality of apertures extending from the front surface to the back surface, the apertures extending from a common area adjacent the back surface to the front surface; and
    removing gases from the process region by providing vacuum to the pumping liner and the plurality of apertures in the gas funnel through a purge ring positioned adjacent the back surface of the gas funnel,
    wherein the plurality of apertures in the gas funnel are separated into radial zones, each radial zone at a different distance from the central axis and having a plurality of openings in the front surface of the gas funnel.

2. The processing method of claim 1, wherein each of the radial zones comprises a plurality of apertures extending around the central axis in a circular pattern.

3. The processing method of claim 2, wherein vacuum is applied to the purge ring through at least two openings, each opening connected to a leg of a purge ring exhaust line, the legs of the purge ring exhaust line merging at a junction to exhaust downstream of the junction.

4. The processing method of claim 3, wherein the purge ring exhaust line comprises a dump valve downstream of the junction and upstream of the exhaust.

5. The processing method of claim 4, further comprising a plenum exhaust line connecting the plenum to exhaust.

6. The processing method of claim 5, wherein there are two openings in the plenum and each opening is in fluid communication with an end of the plenum exhaust line, the ends of the plenum exhaust line connecting at a plenum exhaust junction.

7. The processing method of claim 5, wherein the plenum exhaust line joins the purge ring exhaust line at a union downstream of the dump valve of the purge ring exhaust line.

8. The processing method of claim 7, further comprising operating a valve that controls a flow amount from each of the plenum exhaust line and the purge ring exhaust line.

9. The processing method of claim 8, further comprising using a controller to operate the processing method, the controller configured to control a flow of gas into the opening in the gas funnel and out of the gap between the gas funnel and the showerhead through the plurality of apertures in the showerhead.

10. The processing method of claim 9, wherein the controller is further configured to control a flow of gas through the apertures in the showerhead into the gap between the gas funnel and the showerhead and out of the gap through the plurality of apertures in the gas funnel.

11. The processing method of claim 10, wherein the controller is further configured to meter the flow of gas through the dump valve.

12. The processing method of claim 10, wherein the controller is further configured to meter the flows of gases through the plenum exhaust line and the purge ring exhaust line.

13. The processing method of claim 1, further comprising powering a thermal element within a body of the purge ring.

14. The processing method of claim 13, wherein the thermal element is positioned closer to a central axis of the body than a circular channel of the purge ring.

15. The processing method of claim 14, wherein the thermal element comprises a heater with a power capacity up to 3200 W.

* * * * *